United States Patent
Li et al.

(10) Patent No.: US 6,436,302 B1
(45) Date of Patent: Aug. 20, 2002

(54) POST CU CMP POLISHING FOR REDUCED DEFECTS

(75) Inventors: Juy-Lung Li, San Jose; Tse-Yong Yao, San Francisco; Fred C. Redeker; Rajeev Bajaj, both of Fremont; Yutao Ma, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/492,267

(22) Filed: Jan. 27, 2000

Related U.S. Application Data

(60) Provisional application No. 60/149,904, filed on Aug. 23, 1999.

(51) Int. Cl.[7] .................... H01L 21/463; H01L 21/465

(52) U.S. Cl. .................. 216/38; 216/52; 216/53; 134/3; 134/7; 252/79.1; 438/693; 510/175

(58) Field of Search .................. 216/18, 38, 52, 216/53, 89, 106; 510/175; 252/79.1; 134/3, 7, 32, 41; 438/693, 959

(56) References Cited

U.S. PATENT DOCUMENTS

| | | | |
|---|---|---|---|
| 3,889,753 A | 6/1975 | Richardson | 166/307 |
| 4,090,562 A | 5/1978 | Lybarger et al. | 166/307 |
| 4,541,945 A | 9/1985 | Anderson et al. | 252/149 |
| 4,954,142 A | 9/1990 | Carr et al. | 51/309 |
| 5,084,071 A | 1/1992 | Nenadic et al. | 51/309 |
| 5,225,034 A | 7/1993 | Yu et al. | 156/636 |
| 5,340,370 A | 8/1994 | Cadien et al. | 51/308 |
| 5,478,436 A | 12/1995 | Wineberg et al. | 156/636.1 |
| 5,509,970 A | 4/1996 | Shiramizu | 134/3 |
| 5,527,423 A | 6/1996 | Neville et al. | 156/636.1 |
| 5,645,682 A | 7/1997 | Skrovan | 156/636.1 |
| 5,662,769 A | 9/1997 | Schonauer et al. | 438/633 |
| 5,830,280 A | 11/1998 | Sato et al. | 134/2 |
| 5,876,508 A | 3/1999 | Wu et al. | 134/2 |

(List continued on next page.)

FOREIGN PATENT DOCUMENTS

| | | | |
|---|---|---|---|
| DE | 2154234 | | 5/1973 |
| DE | 3424329 A1 | | 1/1986 |
| EP | 0400047 B1 | | 12/1990 |
| EP | 0496605 B1 | | 7/1992 |
| EP | 0860860 A2 | | 8/1998 |
| FR | 2722511 | | 1/1996 |
| JP | 62-160406 | | 7/1987 |
| WO | WO 99/46353 | | 9/1999 |
| WO | WO 00/11034 | * | 7/2000 ......... H01L/21/306 |

OTHER PUBLICATIONS

Brusic, V. et al., "Cooper Corrosion With and Without Inhibitors", J. Electrochem. Soc., vol. 138, No. 8, Aug. 1991.

Greer et al., "Process for removing wafer surface contaminants", IBM Technical Disclosure Bulletin, vol. 15, No. 8, Jan. 1973, p. 2358.

Hyames et al., "Chemical–mechanical polishing for fabricating patterned W metal features as chip interconnects", Journal of the Electrochemical Societs, vol. 138, No. 11, Nov. 1991.

(List continued on next page.)

*Primary Examiner*—Randy Gulakowski
*Assistant Examiner*—Allan Olsen
(74) *Attorney, Agent, or Firm*—McDermott, Will & Emery

(57) ABSTRACT

Cu metallization is treated to reduce defects and effect passivation, and to reduce leakage between lines, by removing surface defects subsequent to CMP and barrier layer removal. Embodiments include the sequential steps of: CMP and barrier layer removal; buffing with a solution comprising citric acid, ammonium hydroxide and deionized water to remove copper oxide; rinsing with deionized water or an inhibitor solution, e.g., benzotriazole or 5-methyl triazole in deionized water; buffing with an abrasive slurry; and rinsing with deionized water or an inhibitor solution.

13 Claims, 2 Drawing Sheets

U.S. PATENT DOCUMENTS

| | | | | |
|---|---|---|---|---|
| 5,879,226 A | | 3/1999 | Robinson | 451/287 |
| 5,897,426 A | * | 4/1999 | Somekh | 451/41 |
| 5,954,997 A | * | 9/1999 | Kaufman et al. | 252/79.1 |
| 5,981,454 A | * | 11/1999 | Small | 510/175 |
| 6,033,993 A | | 3/2000 | Love, Jr. et al. | 438/745 |
| 6,060,306 A | * | 5/2000 | Kaufman et al. | 252/79.4 |
| 6,068,879 A | * | 5/2000 | Pasch | 427/97 |
| 6,080,709 A | * | 6/2000 | Ishikawa et al. | 510/175 |
| 6,083,840 A | | 7/2000 | Mravic et al. | 438/693 |
| 6,117,775 A | * | 9/2000 | Kondo et al. | 438/690 |
| 6,117,783 A | * | 9/2000 | Small et al. | 438/693 |
| 6,147,002 A | * | 11/2000 | Kneer | 438/692 |
| 6,162,301 A | | 12/2000 | Zhang et al. | 134/3 |
| 6,194,317 B1 | * | 2/2001 | Kaisaki et al. | 438/692 |
| 6,274,059 B1 | | 8/2001 | Krusell et al. | 216/88 |
| 6,277,203 B1 | | 8/2001 | Jiang et al. | 134/2 |
| 6,303,551 B1 | | 10/2001 | Li et al. | 510/175 |

OTHER PUBLICATIONS

| | | | |
|---|---|---|---|
| 6,319,330 B1 | 11/2001 | Jiang et al. | 134/2 |
| 6,352,595 B1 | 3/2002 | Svirchevski et al. | 134/3 |

Kaufman et al., "Chemical–mechanical polishing for fabricating patterned W metal features as chip interconnects", Journal of the Electrochemical Societs, vol 138, No. 11, Nov. 1991.

Kern, "Radiochemical study of semiconductor surface contamination", RCA Review, Jun. 1970, vol. 31, pp. 207–264, see p. 249.

Pak, "Impace of EDTA on junction and photolyte qualities", Extended Abstracts, Oct. 1980, vol. 80, No. 2, pp. 1241–1243.

Patent Abstracts of Japan, vol. 16. No. 29, (C–904), Jan. 24, 1992, and JP 3242352, Oct. 29, 1991.

* cited by examiner

US 6,436,302 B1

POST CU CMP POLISHING FOR REDUCED DEFECTS

RELATED APPLICATION

This application claims priority from Provisional Patent Application Ser. No. 60/149,904 filed Aug. 23, 1999 entitled "POLISHING METHOD FOR REDUCED DEFECTIVITY", the entire disclosure of which is hereby incorporated by reference herein.

TECHNICAL FIELD

The present invention relates to copper (Cu) and/or Cu alloy metallization in semiconductor devices with improved planarity, reduced defects and reduced leakage between lines. The present invention is applicable to manufacturing high speed integrated circuits having submicron design features and high conductivity interconnect structures with improved reliability.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance and capacitance) interconnect pattern, particularly wherein submicron vias, contacts and trenches have high aspect ratios imposed by miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometric shrink to submicron levels.

A conductive plug filling a via hole is typically formed by depositing an interlayer dielectric on a conductive layer comprising at least one conductive pattern, forming an opening through the interlayer dielectric and filling the opening with a conductive material, such as tungsten (W). Excess conductive material on the surface of the interlayer dielectric is typically removed by chemical-mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section. The entire opening is filled with a conductive material, typically a metal, to simultaneously form a conductive plug in electrical contact with a conductive line.

Cu and Cu alloys have received considerable attention as a candidate for replacing Al in interconnect metallizations. Cu is relatively inexpensive, easy to process, and has a lower resistively than Al. In addition Cu has improved electrical properties, vis-à-vis W, making Cu a desirable metal for use as a conductive plug as well as conductive wiring.

An approach to forming Cu plugs and wiring comprises the use of damascene structures. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), tungsten (W), tungsten nitride (WN), titanium-titanium nitride (Ti—TiN), titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

In conventional CMP techniques, a wafer carrier assembly is rotated in contact with a polishing pad in a CMP apparatus. The polishing pad is mounted on a rotating turntable or platen, or moving above a stationary polishing table, driven by an external driving force. The wafers are typically mounted on a carrier or polishing head which provides a controllable pressure urging the wafers against the polishing pad. Thus, the CMP apparatus effects polishing or rubbing movement between the surface of each thin semiconductor wafer and the polishing pad while dispersing a polishing chemical with or without abrasive particles in a reactive solution to effect both chemical activity and mechanical activity while applying a force between the wafer and a polishing pad.

It is extremely difficult to planarize a Cu surface, as by CMP of a damascene inlay, without generating a high degree of surface defects, such as corrosion, scratches, pitting and embedded abrasive particles. A dense array of Cu features is typically formed in an interlayer dielectric, such as a silicon oxide layer, by a damascene technique wherein trenches are initially formed. A barrier layer, such as a Ta-containing layer, e.g., Ta, TaN, is then deposited lining the trenches and on the upper surface of the silicon oxide interlayer dielectric. Cu or a Cu alloy is then deposited, as by electroplating, electroless plating, physical vapor deposition (PVD) at a temperature of about 50° C. to about 150° C. or chemical vapor deposition (CVD) at a temperature under about 200° C., typically at a thickness of about 8,000 Å to about 18,000 Å. CMP is then conducted to remove the Cu or Cu alloy overburden stopping on the barrier layer. Polishing is then continued, as by buffing, employing a mixture of a chemical agent and abrasive particles, to remove the barrier layer. Alternatively, CMP can be conducted directly down to the interlayer dielectric. Buffing is optionally conducted on the interlayer dielectric surface, leaving a Cu or the Cu alloy filling the damascene opening with an exposed surface having a high concentration of defects. These defects include corrosion, e.g., corrosion stains, microscratches, micropitting and surface abrasive particles.

Cu and Cu alloy wafers exhibit a much greater tendency to scratch during planarization than dielectric materials, such as oxides or nitrides. Cu or Cu alloy surfaces corrode very easily and are difficult to passivity in high or low pH aqueous environments. Conventional practices for planarizing Cu or Cu alloys disadvantageously result in a high defect count subsequent to planarization. Conventional wafer cleaning alone cannot completely eliminate such defects which adversely impact device performance and reliability, particularly as device geometries shrink into the deep submicron range. Moreover, it is difficult to effectively planarize a surface containing a dense array of Cu or Cu alloy lines without encountering leakage between the lines, particularly as the distance between lines is reduced to satisfy the demand for greater miniaturization.

There exists a need for methodology enabling the planarization of Cu and Cu alloys with a significantly reduced surface defect count and reduced leakage between closely spaced lines. There exists a further need for such enabling methodology that is compatible with conventional CMP and buffing techniques and apparatuses.

DISCLOSURE OF THE INVENTION

An aspect of the present invention is an efficient method of planarizing Cu and Cu alloys with significantly reduced surface defects.

Another aspect of the present invention is an efficient method of treating a planarized surface containing Cu metallization to significantly reduce surface defects and leakage between lines.

Additional aspects and other features of the present invention will be set forth in part in the description which follows and in part will become apparent to those having ordinary skill in the art upon examination of the following or may be learned from the practice of the present invention. The aspects of the present invention may be realized and obtained as particularly pointed out in the appended claims.

According to the present invention, the foregoing and other aspects are implemented in part by a method of planarizing a surface containing copper (Cu) or a Cu alloy and reducing surface defects; the method comprising: conducting chemical-mechanical polishing (CMP) to planarize the surface; buffing with an abrasive slurry; rinsing with an inhibitor solutions; buffing with a solution to remove copper oxide; and rinsing with an inhibitor.

Another aspect of the present invention is a method of planarizing a wafer surface comprising Cu or a Cu alloy and reducing surface defects, the method comprising the sequential steps: (a) conducting chemical-mechanical polishing (CMP) to planarize the surface; (b) buffing with a solution to remove copper oxides; (c) rinsing with deionized water or an inhibitor solution; (d) buffing with an abrasive slurry; and (e) rinsing with deionized water or an inhibitor solution.

Embodiments of the present invention include employing a solution containing citric acid, ammonium hydroxide and deionized water in step (b) to remove copper oxide, e.g., a solution having a pH of about 3.9 to about 4.1 comprising up to about 26 wt. % citric acid, up to about 5 wt. % of ammonium hydroxide, and deionized water. Embodiments of the present invention also include forming an interconnection structure comprising openings in a silicon oxide interlayer dielectric lined with a barrier layer, such as a Ta-containing barrier layer, e.g., Ta or TaN, and filled with Cu or a Cu alloy, and treating the exposed planarized and buffered upper surface of the Cu or Cu alloy to remove surface defects and effect passivation by sequentially buffing with a solution containing citric acid, ammonium hydroxide and deionized water, rinsing with deionized water or an inhibitor solution, buffing with an abrasive slurry, followed by rinsing with deionized water or an inhibitor solution.

Additional aspects of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
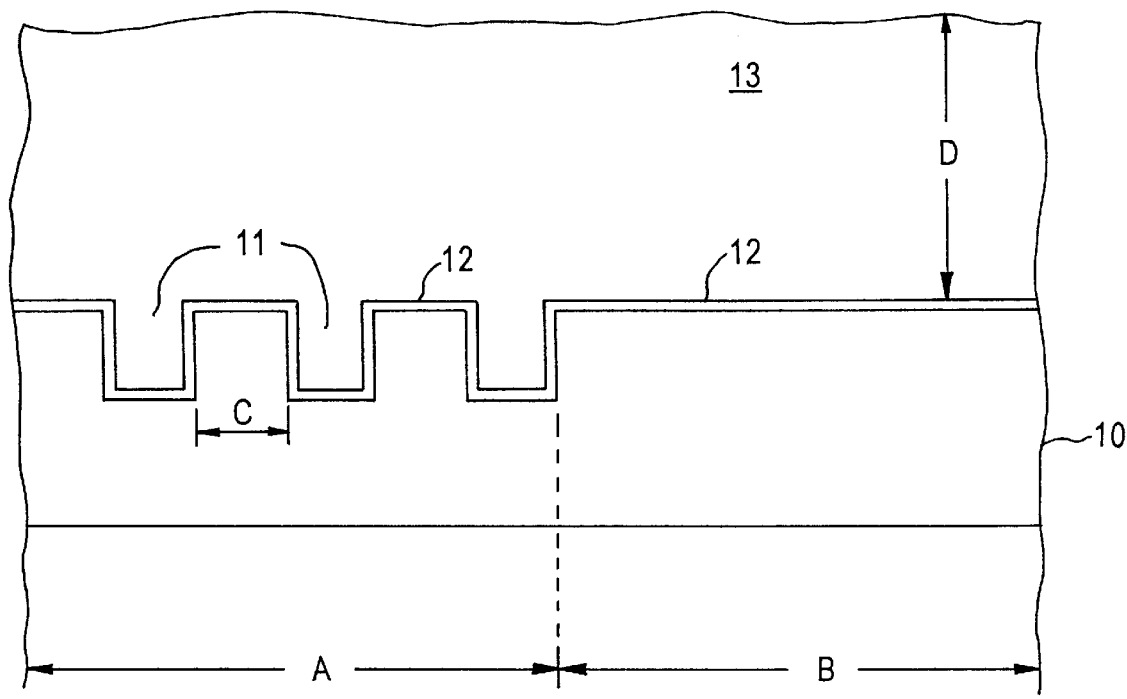
FIGS. 1–4 illustrate sequential phases of a method in accordance with an embodiment of the present invention.

The slurries conventionally employed for CMP of Cu are a complex mixture of oxidizing, etching, complexing and inhibiting chemistries. Accordingly, multiple reactions occur during CMP. In order to reduce surface defects, complete cessation of these reactions at the conclusion of the polishing process is necessary. Unfortunately, copper surface oxidation, corrosion and scratching typically result from conventional CMP methodology.

The present invention enables effective and efficient planarization of Cu metallization with significantly reduced defects, such as corrosion, scratches, pitting and embedded abrasive particles, consistent with the ever increasing demands for reliable interconnect patterns having feature sizes in the deep sub-micron range. As used throughout this disclosure, the symbol Cu is intended to encompass high purity elemental copper as well as copper-based alloys, e.g., copper-based alloys containing at least about 80 at. % copper.

The aspects of the present invention are achieved by employing a strategic multi-step process that effectively cleans and passivates the Cu surface subsequent to CMP and barrier layer removal. The multi-step methodology of the present invention effects cleaning of the surface of the inlaid Cu metallization containing defects generated during CMP and barrier layer removal leaving a relatively defect-free, passivated surface. Such cleaning can comprise removing a thin surface layer of the inlayed Cu metallization and/or removing corrosion stains, typically copper oxide and/or copper hydroxide mixed with corrosion by-products. The multi-step methodology of the present invention comprises treating the exposed surface of Cu metallization after barrier layer removal by buffing with an abrasive slurry, rinsing with an inhibitor solution, buffing with a solution capable of removing copper oxide, e.g., a solution comprising citric acid, ammonium hydroxide and deionized water, and then rinsing with an inhibitor.

The present invention enables a dramatic decrease in defects stemming from planarizing Cu and Cu alloys by CMP. Such defects include surface oxidation, corrosion and scratching which occur during conventional CMP of Cu. An embodiment of the present invention is a method comprising a sequence of manipulative steps including an initial slurry buffing of the wafer surface after CMP employing a conventional abrasive slurry typically employed for CMP of Cu or barrier layer CMP, e.g., Ta or TaN CMP, using a conventional soft polishing pad. Such conventional slurries typically comprise abrasive particles with or without a corrosion inhibitor. Following slurry buffing, a high-pressure rinse is applied to the polishing pad to remove any slurry from the polishing pad, e.g., with deionized water. The surface of the wafer is then rinsed with inhibitor solution, e.g., a solution comprising benzotriazole (BTA) or 5-methyl triazole (TTA) and deionized water.

Buffing is then conducted with a solution capable of removing copper oxide, such as a solution containing citric acid, ammonium hydroxide and deionized water. A suitable composition includes about 0.20 wt. % to about 3.2 wt. % ammonium hydroxide, about 2.0 wt. % to about 26 wt. % citric acid, the balance deionized water. A final rinsing step is conducted with an inhibitor solution, e.g., a solution comprising BTA or TTA.

The exact mechanism underpinning the dramatic reduction in defects attendant upon practicing the inventive sequence of manipulative steps is not known with certainty. It is believed, however, that the initial slurry buffing step breaks the surface film thereby enabling removal of copper oxide and surface oxidation thereon with minimal or virtually no scratching. The final rinsing step with an inhibitor solution of BTA or TTA passivates the freshly cleaned surface, thereby preventing further defects. Experimentation demonstrated that the inventive methodology is capable of reducing surface defectively of even previously polished waters by 75%.

Upon further experimentation and investigation, it was found that not only can surface defects be dramatically reduced but leakage between lines, particularly closely spaced Cu or Cu alloy lines, prevented or significantly reduced by reversing the initial buffing with an abrasive slurry and buffing with a solution capable of removing copper oxide steps. Thus, in accordance with another embodiment of the present invention, the wafer surface is initially planarized by removing the Cu metallization and barrier layer, and the exposed surface containing defects is treated by initially buffing with a solution capable of removing copper oxide, e g., a solution containing citric acid, ammonium hydroxide and/or an amine, and deionized water, followed by rinsing with deionized water or an inhibitor solution. Buffing is then conducted with an abrasive slurry followed by rinsing with deionized water or aninhibitor solution.

The step of buffing with an abrasive slurry in accordance with the embodiments of the present invention can be conducted employing any conventional slurry, such as a slurry of alumna or silica abrasive particles. Suitable inhibitors include benzotriazole and 5-methytriazole. Suitable solutions for removing copper oxide can have a pH of about 3.9 to about 4.1 and comprise up to about 26 wt. % citic acid, such as about 2.0 wt. % to about 26 wt. % citric acid, e.g., about 2.16 wt. % to about 25.9 wt. % citric acid, up to about 5 wt. % ammonium hydroxide and/or an amine, such as about 0.2 wt. % to about 3.2 wt. % ammonium hydroxide, e.g., about 0.26 wt % to about 3.1 wt. % ammonium hydroxide the remainder deionized water.

The exact mechanism underpinning the reduction of defects and surface passivation, coupled with reduced leakage between lines achieved by embodiments of the present invention is not known with certainty. However, it is believed that the sequential treatment in accordance with the present invention subsequent to barrier layer removal removes a thin layer of the surface of the Cu metallization containing defects and/or removes corrosion stains leaving a relatively defect-free surface, and promptly passivates the relatively defect free-surface to avoid the generation of further defects. Corrosion, unlike static etching, is non-uniform and, hence, should be avoided. In addition, it is believed that the sequential treatment removes CMP by-products between lines, thereby reducing leakage.

Treatment with a corrosion inhibitor can comprise the use of any of various corrosion inhibitors, such as benzotriazole (BTA) or 5-methyl-1-benzotriazole (TTA), for about 3 seconds to about 10 seconds, e.g., about 5 seconds. It is believed that treatment with the solution containing deionized water, citric acid, and ammonium hydroxide effects removal of up to about 100 Å of the surface of the Cu metallization and/or corrosion stains, generated by surface corrosion, microscratching and pitting, leaving a substantially defect free surface. This surface treatment can be conducted for about 10 seconds to about 20 seconds.

Embodiments of the present invention include removing the Cu overburden and barrier layer in various ways. It was found suitable to remove to initially most of the Cu overburden by CMP on a first platen leaving a thin discontinuous film of Cu on the barrier layer. Buffing is then conducted on a second platen to remove the remaining thin discontinuous Cu film and barrier layer. The exposed surface of the Cu metallization containing defects is then treated by performing the multi-step procedure of the present invention on a third platen.

Conventional substrates and interlayer dielectrics are encompassed by the present invention. For example, the substrate can be doped monocrystalline silicon or gallium-arsenide. The interlayer dielectric can comprise any of various dielectric materials conventionally employed in the manufacture of semiconductor devices. For example, dielectric materials, such as silicon dioxide, phosphorus-doped silicon glass (PSG), boron- and phosphorous-doped silicon glass (BPSG) and silicon dioxide derived from tetraethyl orthosilicate (TEOS) or silane by plasma enhanced chemical vapor deposition (PECVD) can be employed. Interlayer dielectrics in accordance with the present invention can also comprise low dielectric content materials, including polymers, such as polyamides, and carbon-containing silicon dioxide. The openings are formed in interlayer dielectrics by conventional photolithographic and etching techniques.

An embodiment of the present invention is schematically illustrated in FIGS. 1–4, wherein similar features bear similar reference numerals. Adverting to FIG. 1, interlayer dielectric 10, e.g., silicon oxide, is formed overlying a substrate (not shown). A plurality of openings 11 are formed in a designated area A in which a dense array of conductive lines are to be formed bordering an open field B. A barrier layer 12, e.g., TaN, is deposited lining the openings 11 and on the upper surface of silicon oxide interlayer dielectric 10. Typically, the openings 11 are spaced apart by a distance C which is less than about 1 micron, e.g., about 0.2 micron. Cu layer 13 is then deposited at a thickness D of about 8,000 Å to about 18,000 Å.

Figure 2:
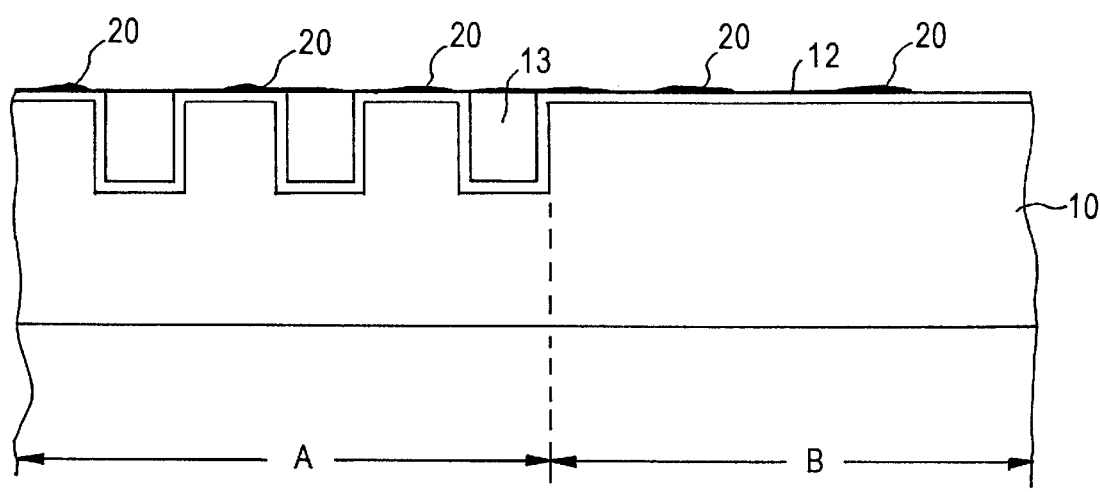
Figure 3:
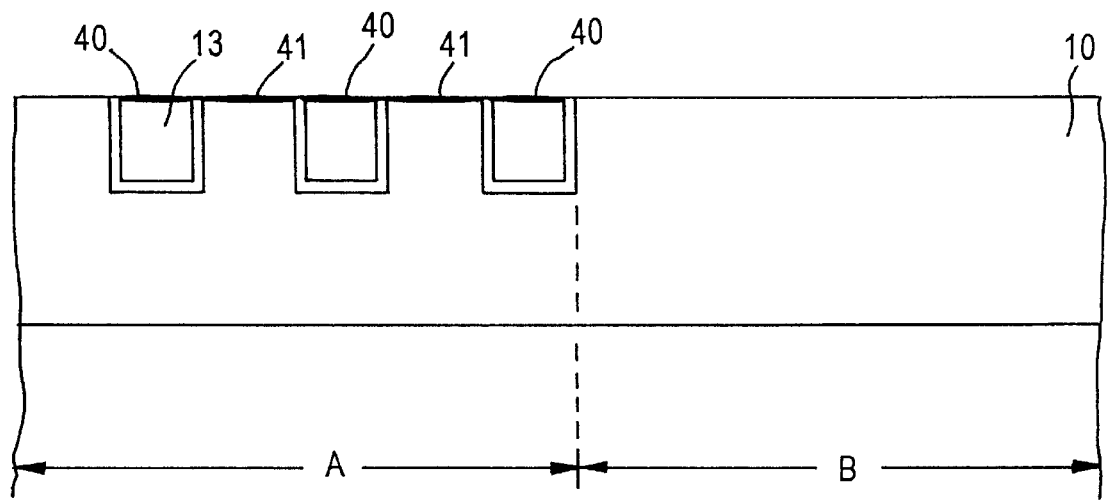
Figure 4:
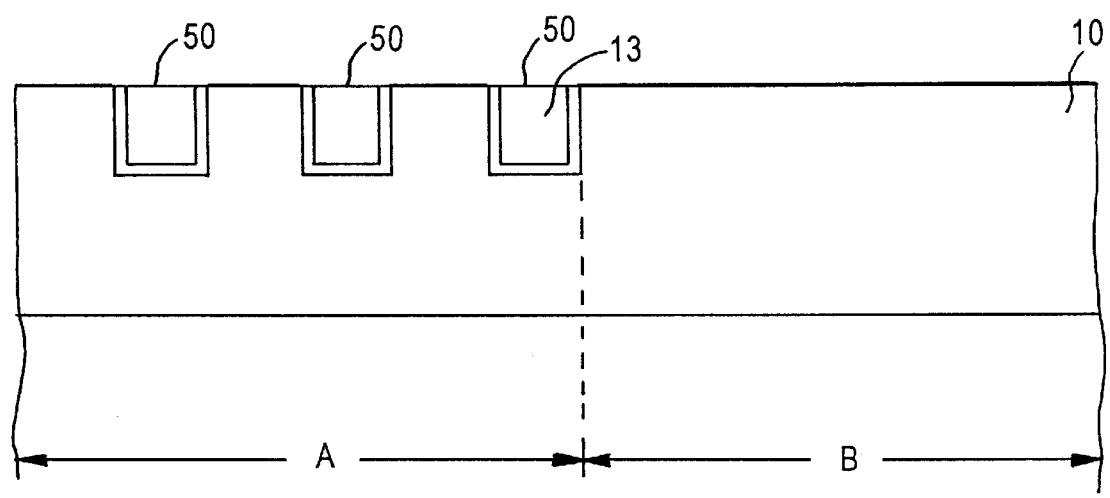

Adverting to FIGS. 1 and 2, CMP is initially conducted on a first platen to remove most of the Cu overburden leaving a thin discontinuous Cu film 20 on TaN barrier layer 12. As shown in FIGS. 2 and 3, buffing is conducted to remove the thin discontinuous Cu film 20 and TaN layer 12. The resulting Cu interconnection structure comprises a dense array A of Cu lines 13 bordered by open field B. However, the upper surface 40 of the Cu metallization and the dielectric surface 41 exhibit an unacceptably high defect count, e.g., at best 750 defects, comprising primarily corrosion stains, microscratches, micropits and abrasive slurry particles as measured on an ORBOT® analyzer available from Applied Materials, Inc. of Santa Clara, Calif.

In accordance with the present invention, the Cu metallization surface 40 and dielectric surface 41 are treated by a multi-step procedure comprising sequentially: buffing with a solution containing citric acid, ammonium hydroxide and deionized water; rinsing with deionized water or an inhibitor solution; buffing with an abrasive slurry; and rinsing with deionized water or an inhibitor solution. The resulting surface exhibited a substantially reduced defect count, e.g., less than 139, even less than 100, as measured on an ORBIT® analyzer. Moreover, it was found that the areas between the Cu lines were substantially free from residue and contamination, thereby significantly reducing leakage between the Cu lines.

The present invention is applicable to planarizing a wafer surface during various stages of semiconductor manufacturing employing any of various types of CMP systems. The present invention enjoys particular applicability in the manufacture of high density semiconductor devices with metal features in the deep submicron range.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A method of planarizing a surface containing copper (Cu) or a Cu alloy and reducing surface defects, wherein the wafer surface contains an interlayer dielectric having an upper surface and at least one opening; a barrier layer lining the opening and on the upper surface of the interlayer dielectric; and Cu or a Cu alloy filling the opening and on the barrier layer, the method comprising:

conducting chemical-mechanical polishing (CMP) to planarize the surface on a first platen to remove most of the Cu or Cu alloy layer leaving a film of Cu or Cu alloy on the barrier layer;

a first buffing on a second platen to remove the Cu or Cu alloy film and barrier layer leaving the Cu or Cu alloy layer in the opening with a exposed surface containing defects;

a second buffing with one of an abrasive slurry and a solution to remove copper oxide;

rinsing with an inhibitor solution following said second buffing;

a third buffing with another one of said abrasive slurry and said solution to remove copper oxide; and rinsing with an inhibitor solution following said third buffing.

2. The method according to claim 1, wherein:

the solution capable of removing copper oxide comprises citric acid, ammonium hydroxide and deionized water; and the inhibitor solution comprises benzotriazole or five-methyl triazole.

3. A method of planarizing a wafer surface containing copper (Cu) or a Cu alloy and reducing surface defects, wherein the wafer surface contains an interlayer dielectric having an upper surface and at least one opening; a barrier layer lining the opening and on the upper surface of the interlayer dielectric; and Cu or a Cu alloy filling the opening and on the barrier layer, the method comprising the sequential steps of:

(a) conducting chemical-mechanical polishing (CMP) to planarize the surface on a first platen to remove most of the Cu or Cu alloy layer leaving a film of Cu or Cu alloy on the barrier layer, and buffing on a second platen to remove the Cu or Cu alloy film and barrier layer leaving the Cu or Cu alloy layer in the opening with an exposed surface containing defects;

(b) buffing with a solution to remove copper oxide;

(c) rinsing with deionized water or an inhibitor solution;

(d) buffing with an abrasive slurry; and (e) rinsing with deionized water or an inhibitor solution.

4. The method according to claim 3, wherein the solution employed in step (b) comprises citric acid, ammonium hydroxide and deionized water.

5. The method according to claim 4, wherein the inhibitor solution employed in step (c) and/or step (e) comprises benzotriazole or five-methyl triazole.

6. The method according to claim 4, wherein the solution employed in step (b) comprises about 2.0 wt. % to about 26 wt. % citric acid, about 0.020 wt. % to about 3.2 wt % ammonium hydroxide, the remainder deionized water.

7. The method according to claim 6, wherein the solution employed in step (b) comprises about 2.16 wt. % to about 25.9 wt. % citric acid and about 0.26 wt. % to about 3.1 wt. % ammonium hydroxide.

8. The method according to claim 7, wherein the solution employed in step (b) comprises about 8.63 wt. % citric acid and about 1.03 wt % ammonium hydroxide.

9. The method according to claim 5, wherein the inhibitor solution comprises about 0.01 wt. % to about 0.50 wt, % benzotriazole or 5-methyl-1-benzotriazole and deionized water.

10. The method according to claim 4, wherein the solution employed in step (b) comprises up to about 26 wt. % citric acid, up to about 5 wt. % ammonium hydroxide or an amine or up to about 5 wt. % of a combination of ammonium hydroxide and an amine, the remainder deionized water.

11. The method according to claim 3, comprising conducting steps (b) through (c) on a third platen.

12. The method according to claim 4, wherein the solution employed in step (b) has a pH of about 3.9 to about 4.1.

13. The method according to claim 10, wherein the solution employed in step (b) has a pH of about 3.9 to about 4.1.

* * * * *